US012548740B2

(12) United States Patent
Tong et al.

(10) Patent No.: US 12,548,740 B2
(45) Date of Patent: Feb. 10, 2026

(54) APPARATUS TO IMPROVE PROCESS NON-UNIFORMITY FOR SEMICONDUCTOR DIRECT PLASMA PROCESSING

(71) Applicant: Applied Materials, Inc., Santa Clara, CA (US)

(72) Inventors: Edric H. Tong, Sunnyvale, CA (US); Wei Liu, San Jose, CA (US); Victor Calderon, Sunnyvale, CA (US); Rene George, San Carlos, CA (US); Dileep Venkata Sai Vadladi, Sunnyvale, CA (US); Vladimir Nagorny, Tracy, CA (US)

(73) Assignee: Applied Materials, Inc., Santa Clara, CA (US)

( * ) Notice: Subject to any disclaimer, the term of this patent is extended or adjusted under 35 U.S.C. 154(b) by 198 days.

(21) Appl. No.: 18/468,790

(22) Filed: Sep. 18, 2023

(65) Prior Publication Data

US 2025/0069859 A1 Feb. 27, 2025

Related U.S. Application Data

(60) Provisional application No. 63/578,324, filed on Aug. 23, 2023.

(51) Int. Cl.
*H01J 37/32* (2006.01)

(52) U.S. Cl.
CPC ... *H01J 37/32633* (2013.01); *H01J 37/32513* (2013.01); *H01J 2237/327* (2013.01); *H01J 2237/3323* (2013.01)

(58) Field of Classification Search
None
See application file for complete search history.

(56) References Cited

U.S. PATENT DOCUMENTS

| | | | |
|---|---|---|---|
| 8,801,896 B2 | 8/2014 | Todorow et al. |
| 11,658,006 B2 | 5/2023 | Nagorny et al. |

(Continued)

FOREIGN PATENT DOCUMENTS

| | | |
|---|---|---|
| EP | 1668663 B1 | 3/2015 |
| JP | 2021082798 A | 5/2021 |
| WO | 2022245761 A1 | 11/2022 |

OTHER PUBLICATIONS

International Search Repoert issued to patent application No. PCT/US2024/042993 on Dec. 4, 2024.

*Primary Examiner* — Kenneth B Wells
(74) *Attorney, Agent, or Firm* — Patterson + Sheridan, LLP

(57) ABSTRACT

Embodiments of the present disclosure generally relate to high efficiency inductively coupled plasma sources and plasma processing apparatus. Specifically, embodiments relate to grids to improve plasma uniformity. In one embodiment, a plasma processing apparatus is provided. The plasma processing apparatus includes a processing chamber, a substrate support disposed within the processing chamber, a grid support coupled to the processing chamber, and a grid. The grid is coupled to the grid support and disposed above the substrate support. The grid has a plurality of holes and one or more outer openings defined between a circumference of the grid and the grid support. Plasma received from a plasma source is configured to flow through the plurality of holes and the one or more outer openings of the grid towards the substrate support.

18 Claims, 6 Drawing Sheets

(56) References Cited

U.S. PATENT DOCUMENTS

| | | | | |
|---|---|---|---|---|
| 2007/0194245 | A1* | 8/2007 | Yevtukhov ........ | H01L 21/31105 257/E21.25 |
| 2016/0155616 | A1 | 6/2016 | Lee et al. | |
| 2017/0207077 | A1 | 7/2017 | Nagorny et al. | |
| 2018/0358206 | A1 | 12/2018 | Ma et al. | |
| 2022/0208529 | A1* | 6/2022 | Long ..................... | H01J 37/321 |
| 2023/0130162 | A1 | 4/2023 | Lee et al. | |

* cited by examiner

APPARATUS TO IMPROVE PROCESS NON-UNIFORMITY FOR SEMICONDUCTOR DIRECT PLASMA PROCESSING

CROSS-REFERENCE TO RELATED APPLICATIONS

This application claims priority to U.S. Provisional Patent Application Ser. No. 63/578,324, filed on Aug. 23, 2023, which is herein incorporated by reference.

BACKGROUND

Field

Embodiments of the present disclosure generally relate to chambers for direct plasma processing. Specifically, embodiments relate to grids to improve plasma uniformity.

Description of the Related Art

Plasma processing is used in the semiconductor industry for deposition, etching, resist removal, and related processing of semiconductor substrates and other substrates. Plasma sources are often used for plasma processing to produce high density plasma and reactive species for processing substrates.

When treating a semiconductor substrate with plasma, ensuring a uniform distribution of plasma over the substrate is generally desirable. Current processes commonly exhibit non-uniformity of plasma distribution near the edge of the substrate. For example, the distribution of plasma can be non-uniform due to recombination of the plasma on chamber walls near the edge of the substrate.

Therefore, what is needed in the art are improved techniques for uniformly distributing plasma across the substrate.

SUMMARY

In one embodiment, a plasma processing apparatus is provided. The plasma processing apparatus includes a processing chamber, a substrate support disposed within the processing chamber, a grid support coupled to the processing chamber, and a grid. The grid is coupled to the grid support and disposed above the substrate support. The grid has a plurality of holes and one or more outer openings defined between a circumference of the grid and the grid support. Plasma received from a plasma source is configured to flow through the plurality of holes and the one or more outer openings of the grid towards the substrate support.

In another embodiment, a plasma processing apparatus is provided. The plasma processing apparatus includes a processing chamber, a substrate support disposed within the processing chamber, a grid support coupled to the processing chamber, and a grid. The grid is coupled to and suspended below the grid support via a plurality of vertical supports. The grid is disposed above the substrate support. The grid has a plurality of holes and one or more outer openings defined by a circumference of the grid, the grid support, and the vertical supports. The plasma received from a plasma source is configured to flow through the plurality of holes and the one or more outer openings of the grid towards the substrate support.

In another embodiment, a grid assembly is provided. The grid assembly includes a grid support, a grid coupled to the grid support, and a plurality of holes disposed through the grid. The gird assembly further includes one or more outer openings defined between a circumference of the grid and a circumference of the grid support, wherein a plasma is configured to flow through the plurality of holes and the one or more outer openings of the grid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to high efficiency inductively coupled plasma sources and plasma processing apparatus. Specifically, embodiments relate to grids to improve plasma uniformity.

Aspects of the present disclosure are discussed with reference to a "substrate" for purposes of illustration and discussion. Those of ordinary skill in the art, using the disclosures provided herein, will understand that the example aspects of the present disclosure can be used in association with any suitable semiconductor substrate, semiconductor wafer, or other suitable substrate. A "substrate support" refers to any structure that can be used to support a substrate.

Figure 1A:
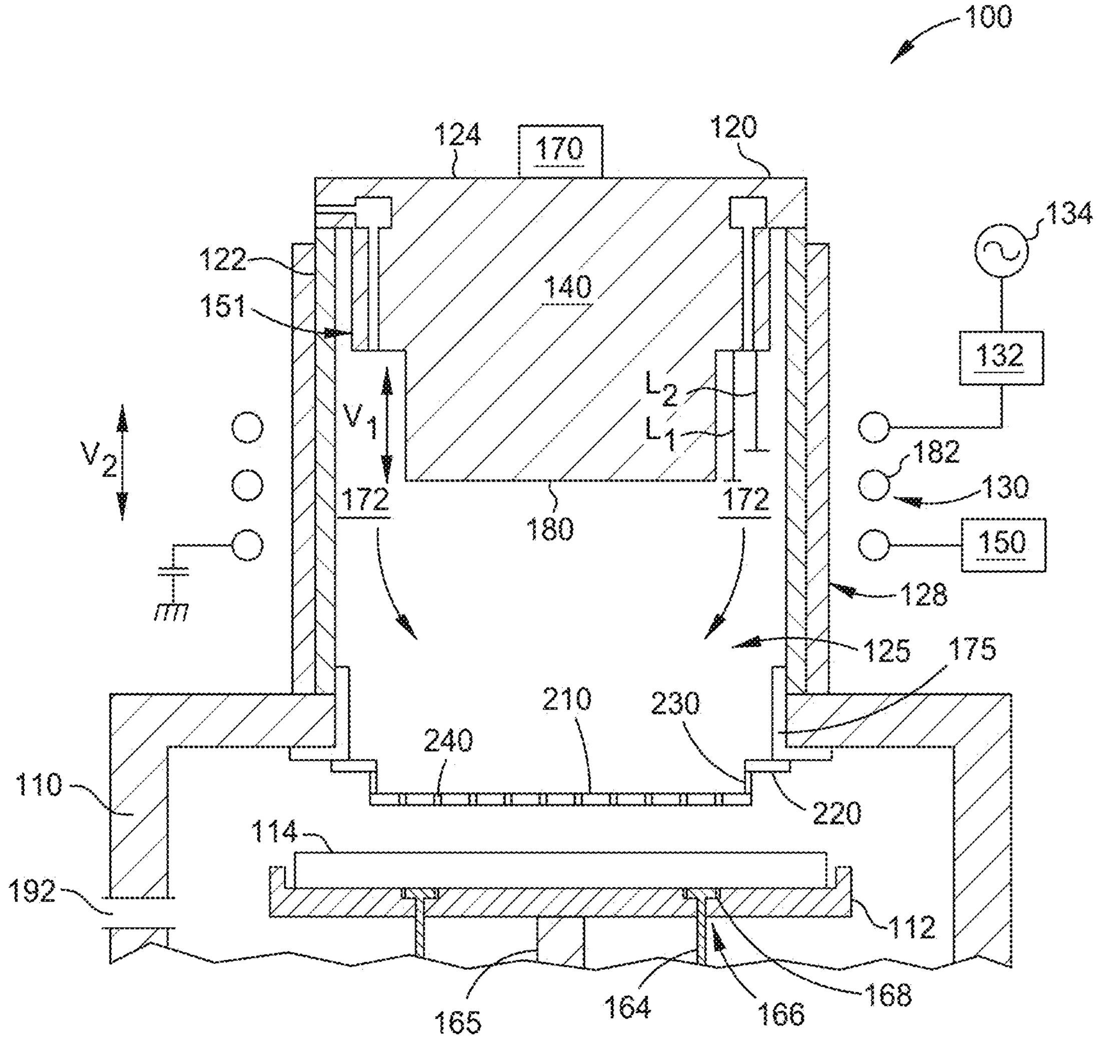
FIG. 1A is a schematic diagram of a plasma processing apparatus with a grid suspended from a grid support, according to at least one embodiment.

FIG. 1A is an example plasma processing apparatus 100 with a grid 210 suspended from a grid support 220. The plasma processing apparatus 100 includes a processing chamber 110 and a plasma source 120 (e.g., a remote plasma source) coupled with the processing chamber 110. The processing chamber 110 includes a substrate support 112 operable to hold a substrate 114. In some embodiments, the substrate has a thickness that is less than 1 mm. The substrate support 112 can be proximate one or more heat sources (not shown) that provide heat to a substrate during processing of the substrate in the process chamber 110. Heat can be provided using any suitable heat source, such as one or more lamps, such as one or more rapid thermal processing lamps, or via a heated pedestal (e.g., a pedestal having resistive heating elements embedded therein or coupled thereto).

A controller (not shown) is coupled to the processing chamber 110, and may be used to control chamber processes described herein. The substrate support 112 is disposed underneath the grid 210. In some embodiments, the substrate support 112 is coupled with a shaft 165. The shaft is connected to an actuator (not shown) that provides rotational movement of the shaft and substrate support (about an axis). The actuator may additionally or alternatively provide height adjustment of the shaft 165 during processing.

The substrate support 112 includes lift pin holes 166 disposed therein. The lift pin holes 166 are sized to accommodate a lift pin 164 for lifting of the substrate 114 from the substrate support 112 either before or after a deposition process is performed. The lift pins 164 may rest on lift pin stops 168 when the substrate 114 is lowered from a processing position to a transfer position.

A plasma can be generated in plasma source 120 (e.g., in a plasma generation region) by induction coil 130, and plasma flows from the plasma source 120 to the surface of substrate 114 through holes 240 provided in the grid 210 that separates the plasma source 120 from the processing chamber 110 (a downstream region).

The plasma source 120 includes a dielectric sidewall 122 and a top cover 124. The dielectric sidewall 122 and top cover 124, integrated with a gas injection insert 140, define a plasma source interior 125. Dielectric sidewall 122 can include any suitable dielectric material, such as quartz. An induction coil 130 is disposed proximate (e.g., adjacent) the dielectric sidewall 122 about the plasma source 120. The induction coil 130 is coupled to an RF power generator 134 through any suitable matching network 132. Feed gases are introduced to the plasma source interior from a gas supply 150. When the induction coil 130 is energized with RF power from the RF power generator 134, a plasma is generated in the plasma source 120. In some embodiments, RF power is provided to induction coil 130 at about 1 KW to about 15 KW, such as about 3 KW to about 10 kW. Induction coil 130 may ignite and sustain a plasma in a wide pressure and flow range. In some embodiments, the plasma processing apparatus 100 includes a grounded Faraday shield 128 to reduce capacitive coupling of the induction coil 130 to the plasma.

To increase efficiency, the plasma processing apparatus 100 includes a gas injection insert 140 disposed in the plasma source interior 125. A plurality of gas injection channels 151 provide the process gas to the plasma source interior 125 through an active zone 172, where, due to enhanced confinement of hot electrons, a reaction between hot electrons and the feed gas occurs. An enhanced electron confinement region or an active zone 172 is defined by sidewalls of gas injection insert and the vacuum tube in a radial direction and by an edge of a bottom surface 180 of the insert from the bottom in vertical direction. The active zone 172 provides an electron confinement region within the plasma source interior 125 for efficient plasma generation and sustaining. The narrow gas injection channels 151 prevent plasma spreading from the chamber interior into the gas injection channel 151. The gas injection channels 151 can be about 1 mm in diameter or greater, such as about 10 mm or greater, such as about 1 mm to about 10 mm. The gas injection insert 140 forces the process gas to be passed through the active zone 172 where plasma is formed.

The capabilities of the gas injection insert 140 to improve efficiency of the plasma processing apparatus 100 are independent of the material of the gas injection insert 140 as long as the walls that are in direct contact with radicals are made of material with a low recombination rate for the radicals. For instance, in some embodiments, the gas injection insert 140 can be made from a metal, such as an aluminum material, with a coating configured to reduce surface recombination. Alternatively, the gas injection insert 140 can be a dielectric material, such as a quartz material, or an insulative material.

The induction coil 130 is aligned with the active region in such a way that the top turn of the coil is above the bottom surface 180 of the gas injection insert 140 and operates substantially in the active region of the inner volume, while the bottom turn of the coil is below the bottom surface 180 and operates substantially outside the active region. The center of the coil is substantially aligned with the bottom surface 180. Within these boundaries, one can adjust the coil position for a desired performance. Alignment of the coil with the bottom surface 180 provides improved source efficiency, namely controlled generation of desired chemical species for plasma processes and delivering the chemical species to the substrate with reduced or eliminated losses. For example, plasma sustaining conditions (balance between local generation and loss of ions) might not be the best for generating species for a plasma process. Regarding delivery of the species to the substrate, efficiency can depend on the volume and wall recombination of these particular species. Hence, control of the alignment of the coil with the bottom surface 180 provides control of the source efficiency for a plasma process.

In some embodiments, a coil has a short transition region near the leads, and the remainder of the coil turns are parallel to the bottom surface 180, in other embodiments, a coil is helical, but one can always define the top and the bottom turn of the coil. In some embodiments, a coil can have 2-5 turns.

In some embodiments, the bottom surface 180 is aligned with a portion of induction coil 130 (e.g., coil loop 182) along an axis by utilizing a suitably sized gas injection insert 140 (and top cover 124, which may be a preformed part of the gas injection insert 140) to form plasma source 120. Alternatively, the bottom surface 180 can be movable along a vertical direction $V_1$ relative to plasma source 120 while a remainder portion of gas injection insert 140 is static (e.g., fixed) as part of plasma source 120, in order to provide alignment of the bottom surface 180 with a portion of induction coil 130. For example, an actuator 170 is coupled to gas injection insert 140 to adjust a position of the bottom surface 180 such that a portion of the gas injection insert 140 having a first length ($L_1$) is adjusted to a second length ($L_2$). Actuator 170 can be any suitable actuator, for example, a motor, electric motor, stepper motor, or pneumatic actuator. In some embodiments, a difference ($\Delta$) in length from $L_1$ to $L_2$ is about 0.1 cm to about 4 cm, such as about 1 cm to about 2 cm.

Additionally or alternatively, the gas injection insert 140 can be coupled to an actuator (such as actuator 170), and actuator 170 is configured to move the entirety of gas injection insert 140 vertically (e.g., along a vertical direction $V_1$ relative to plasma source 120), in order to align the bottom surface 180 with a portion of induction coil 130. Spacers (not shown) can be used to fill gap(s) between gas injection insert 140 and another portion of plasma source 120 (such as between top cover 124 and dielectric sidewall 122) that were formed by moving the insert vertically. The spacers may be formed from, for example, a ceramic material, such as a quartz.

In general, positioning center induction coil 130 above the bottom surface 180 will increase the efficiency of ionization and dissociation, but reduces the transport efficiency of these species to the substrate, as many of the species may recombine on the walls of the narrow active region. Positioning the induction coil 130 below the bottom surface 180 can improve plasma delivery efficiency, but may decrease plasma generation efficiency.

A process liner 175 is disposed on the processing chamber 110 and the plasma source 120 where the plasma source 120 and the processing chamber 110 are coupled together. The process liner 175 prevents process gases and plasma from escaping through where the process chamber 110 and the plasma source 120 are coupled. The grid support 220 is coupled to the processing chamber 110. In some embodiments, the grid support 220 is coupled to the process liner 175, which is coupled to the processing chamber 110. In other embodiments, the grid support 220 is coupled directly to the process chamber 110. The grid 210 is coupled to the grid support 220. The grid 210 is disposed above the substrate support 112. In FIG. 1A, the grid 210 is suspended below the grid support 220. The grid 210 is coupled to the grid support 220 using a plurality of vertical supports 230. The vertical supports 230 are coupled to the grid 210 and the grid support 220. The grid 210, grid support 220, and vertical supports 230 form a grid assembly 200. As shown in FIG. 1A in some embodiments, two vertical supports 230 are used to couple the grid 210 to the grid support 220. In other embodiments, more vertical supports 230 are used, such as three vertical supports 230 in FIG. 2.

The grid 210 includes a plurality of holes 240. The holes 240 are disposed through the grid 210 (e.g., holes 240 traverse the thickness of the grid 210). One or more outer openings 250 (shown in FIG. 2) are defined by the grid 210, the grid support 220, and the vertical supports 230. The grid 210 is configured to separate the processing chamber 110 area from the plasma source 120.

Figure 2:
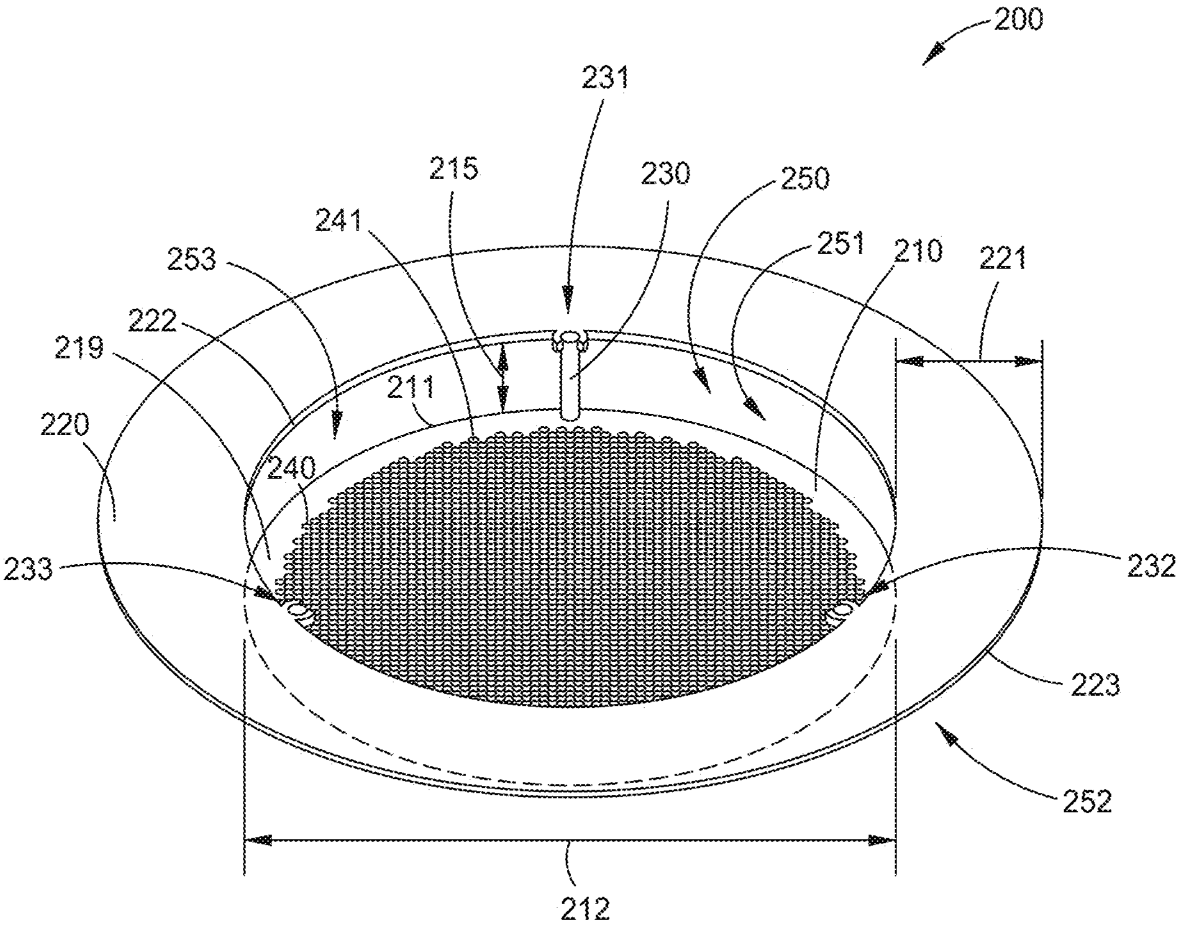
FIG. 2 is an isometric view of the grid and grid support of FIGS. 1A and 1B, according to at least one embodiment.

The grid 210 controls the flow of plasma through the holes 240 and the outer openings 250. The plasma is configured to flow from the plasma source 120 through the grid 210 and outer opening 250 to the substrate support. The plasma source 120 may generate plasma charged particles (ions and electrons), which recombine on the grid 210, so that only neutral plasma species can pass through the grid 210 into the processing chamber 110. The plurality of holes in the bottom section of the grid 210 may have different patterns and sizes, as shown in FIG. 2. The one or more outer openings 250 may have different sizes as shown in FIG. 2.

In some embodiments, the grid 210 is formed of aluminum, anodized aluminum, quartz, aluminum nitride, aluminum oxide, tantalum, tantalum nitride, titanium, titanium nitride, borosilicate, yttrium oxide, yttrium zirconium oxide, or combination(s) thereof. For example, AlN can be beneficial for flux of nitrogen radicals, whereas conventional grids are more prone to nitrogen radical recombination. Similarly, aluminum oxide can provide flux of oxygen or hydrogen radicals, whereas conventional grids are more prone to their recombination. In some embodiments, the grid 210 has a thickness of about 3 mm to about 8 mm, which defines the hole length. A ratio of the grid thickness (length) to the average diameter of the plurality of holes may be greater than about 1:4, such as about 1:2 to about 3:1. In some embodiments, the grid has a diameter of about 150 mm to 300 mm. The diameter of the grid is configured such that a substrate 114 atop the substrate support has a diameter that is greater than the diameter of the grid.

The plasma source 120 is configured to flow plasma towards the grid 210. A portion of the plasma flows through the holes 240 of the grid 210. Another portion of the plasma flows through the outer openings 250 between the grid 210 and the grid support 220. After flowing through the holes 240 and the outer openings 250, the plasma flows to the substrate support 112. The plasma is used to treat the substrate 114. The portion of the plasma that passes through the holes 240 primarily treats a central region of the substrate 114. The portion of plasma that passes through the outer openings 250 primarily treats the edges of the substrate 114. As stated above, the grid 210 acts as a flow manager of the plasma. The grid 210 prevents recombination of plasma on walls of the processing chamber 110.

Recombination of the plasma on the walls limits the plasma that reaches the edges of the substrate 114, causing non-uniform distribution of the plasma across the substrate 114. However, implementing only a grid 210 may not produce uniform distribution of plasma on and/or near the edges of the substrate 114. For example, plasma that passes through the holes 240 of the grid may still be focused near the center of the substrate 114. Accordingly, plasma may be directed to flow directly on the edges of the substrate to ensure the edges are uniformly covered by plasma. Plasma flowing through the outer openings 250 between the grid 210 and the grid support 220 promotes the edges to receive uniform distribution of the plasma. The portion of the plasma that flows through the outer openings 250 will contact the substrate 114 on the edges. By having the plasma contact the edges directly, the plasma will be more uniformly distributed.

An exhaust port 192 is coupled with a sidewall of process chamber 110. In some embodiments, the exhaust port 192 may be coupled with a bottom wall of process chamber 110 to provide azimuthal independence.

The plasma processing apparatus 100 shown in FIG. 1A is an example plasma processing apparatus 100. It is contemplated that the grid assembly 200 could be used in a variety of plasma processing apparatuses not just the one shown in FIG. 1A.

Figure 1B:
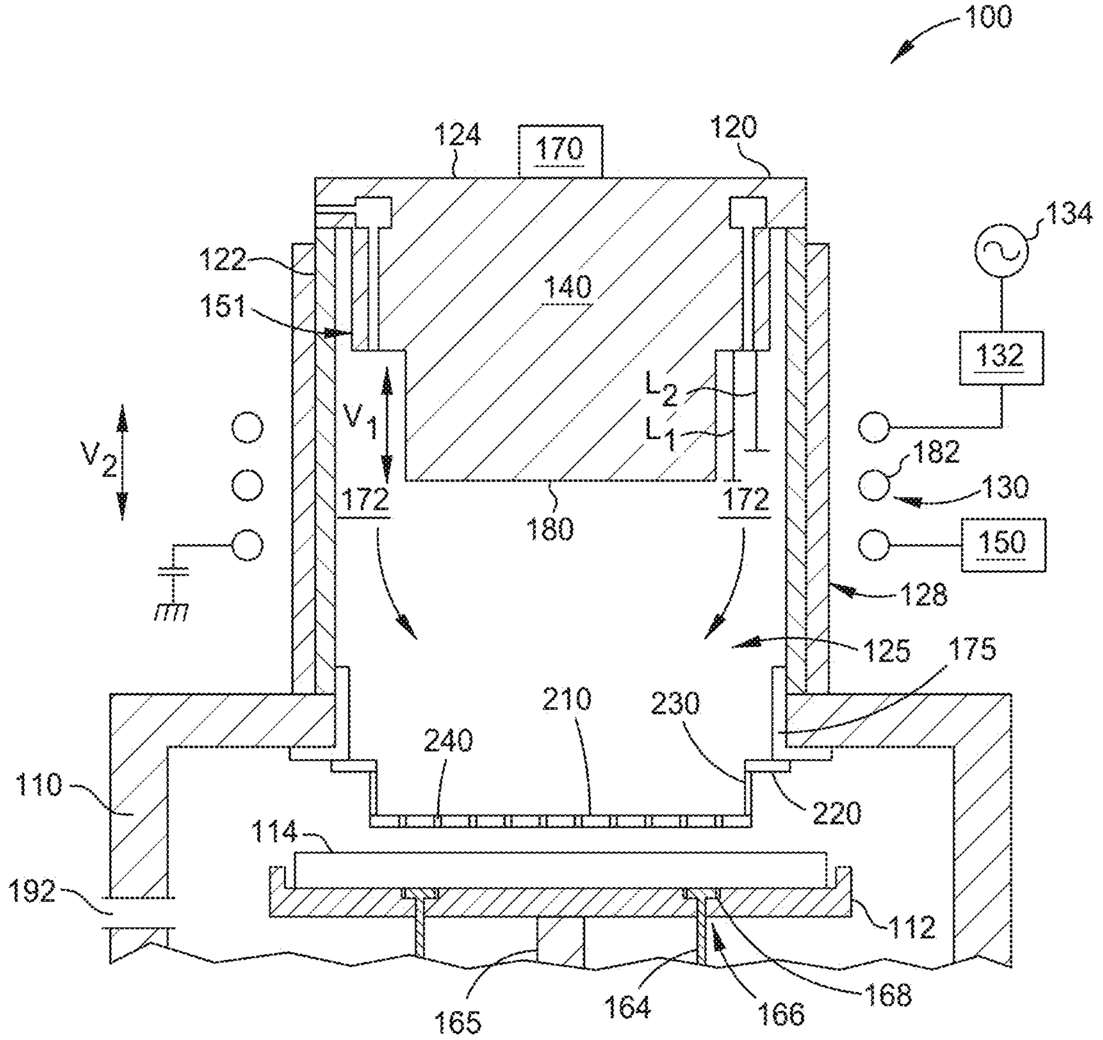
FIG. 1B is a schematic diagram of the plasma processing apparatus of FIG. 1A with a grid suspended from a grid support at a different spacing from the substrate support, according to at least one embodiment.

FIG. 1B is a schematic diagram of the plasma processing apparatus of FIG. 1A with a grid suspended from a grid support 220 at a different spacing from the substrate support. The vertical supports 230 can be adjusted as shown in FIG. 1B to lower the grid position relative to the grid support. The grid 210 can be moved closer to or further away from the substrate support 112. A distance 215 between the grid 210 and the grid support 220 can be adjusted using the vertical supports 230, as described in further detail in conjunction with FIG. 2.

FIG. 2 is an isometric view of the grid 210 and the grid support 220 of FIGS. 1A and 1B. FIG. 2 shows one hole 240 pattern that may be implemented with the grid 210. In some embodiments, other hole 240 patterns are implemented. The holes 240 have a hole diameter 241 that ranges from 0.1 inches to 1 inch. In some embodiments, the hole diameter 241 of the holes 240 varies across the holes 240. In some embodiments, the hole diameter 241 is constant across all of the holes 240. The grid has a first surface 219 with a surface area. In some embodiments, the holes 240 make up about 10% to about 70% of the surface area of the first surface 219 of the grid 210, including 20%, 30%, and 50%. Larger holes 240 may be implemented to increase plasma flow to the substrate 114 and lower distribution over the edges of the substrate 114. Smaller holes 240 may be implemented to decrease plasma flow to the substrate 114 and increase distribution over the edges of the substrate 114.

The plurality of vertical supports 230 are used to couple the grid 210 to the grid support 220. In FIG. 2, three vertical supports 230 are shown, a first vertical support 231, a second vertical support 232, and a third vertical support 233. In some embodiments, a different number of vertical supports 230 is implemented. The vertical supports 230 may be mechanically adjusted to change the distance 215 between the grid 210 and the grid support 220. In some embodiments, the distance 215 is about 1 inch to about 3 inches. The distance 215 is directly related to the distance between the grid 210 and the substrate support 112. The distance between the grid 210 and substrate support 112 affects the distribution of the plasma around the edges of the substrate. The distance between the grid 210 and substrate support 112 creates shadowing effects. When the distance 215 is smaller, the outer openings 250 are smaller, and less plasma reaches the edges of the substrate 114. When the distance 215 is larger, the grid 210 is closer to the substrate support 112, and the shadowing effects occur. Shadowing effects refer to grid assembly 200 casting a shadow on the treated substrate 114 by affecting the distribution of plasma on the substrate 114. For example, when the grid 210 is closer to the substrate support 112, the hole 240 pattern of the grid 210 may be visible on the surface of the substrate 114 because the plasma does not contact the substrate in the location directly below the structure of the hole 240. Since the plasma expands as it travels through the processing chamber 110, distance 215 is selected based on the diameter 241 of the hole 240.

The grid 210 is circular in shape and has a circumference 211 and a diameter 212. The grid support 220 is ring shaped and has a radial length 221, an inner circumference 222, and an outer circumference 223. In some embodiments, the vertical supports 230 are coupled to the grid 210 on the circumference 211 of the grid 210. On the opposite end, the vertical supports 230 are coupled to the grid support 220 on the inner circumference 222 of the grid support 220.

The outer openings 250 are shown in FIG. 2. Each outer opening 250 is defined between a portion of the circumference 211 of the grid 210, a portion of the inner circumference 222 of the grid support 220, and the vertical supports 230. In FIG. 2, three outer openings 250 are shown, a first outer opening 251, a second outer opening 252, and a third outer opening 253. The first outer opening 251 is defined by a first portion of the circumference 211 of the grid 210, a first portion of the inner circumference 222 of the grid support 220, the first vertical support 231, and the second vertical support 232. The second outer opening 252 is defined by a second portion of the circumference 211 of the grid 210, a second portion of the inner circumference 222 of the grid support 220, the second vertical support 232, and the third vertical support 233. The third outer opening 253 is defined by a third portion of the circumference 211 of the grid 210, a third portion of the inner circumference 222 of the grid support 220, the third vertical support 233, and the first vertical support 231.

Figure 3:
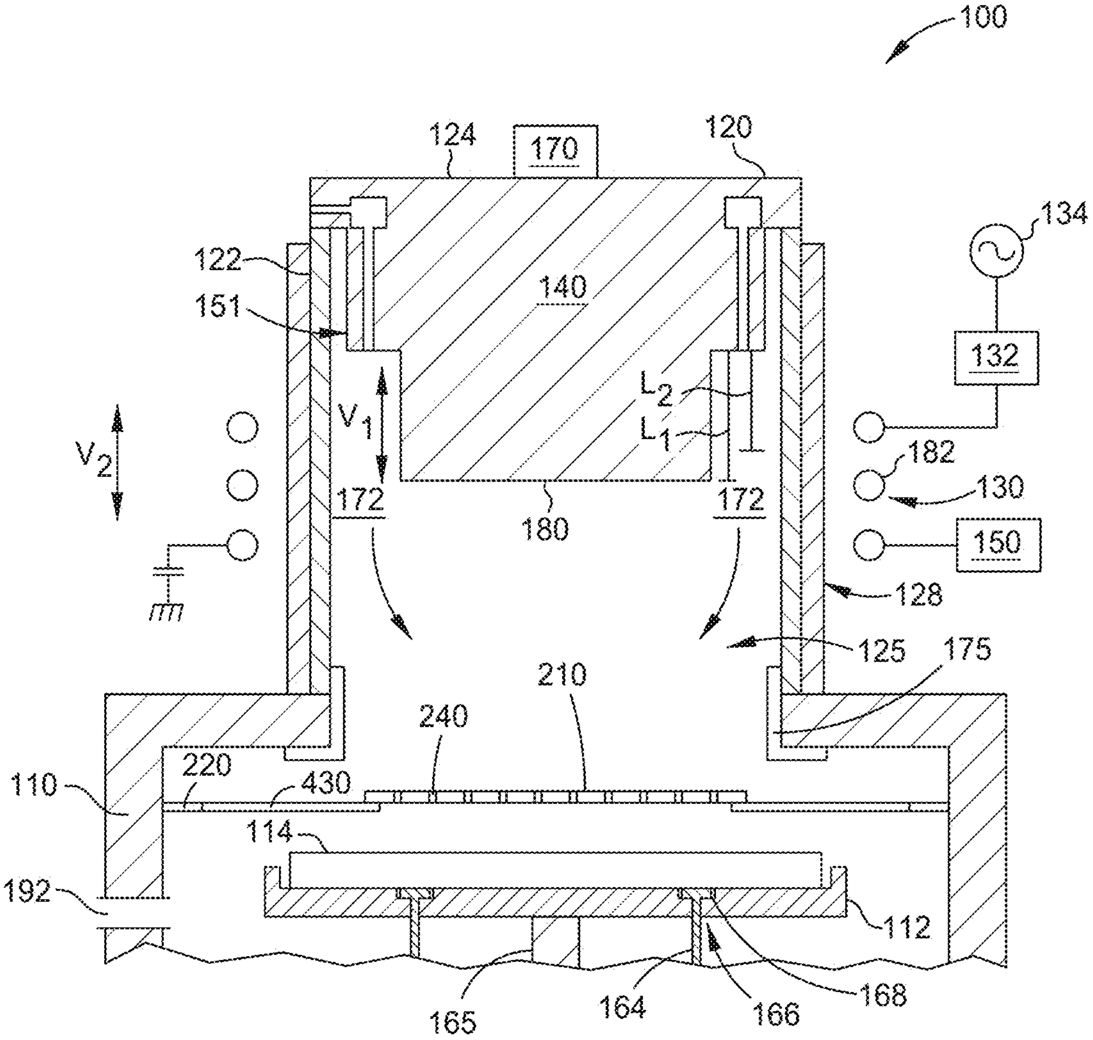
FIG. 3 is a schematic diagram of a plasma processing apparatus with a grid connected to a grid support using spokes, according to at least one embodiment.

FIG. 3 is a schematic diagram of the example plasma processing apparatus 100 with the grid 210 connected to the grid support 220 using a plurality of spokes 430. The example plasma processing apparatus 100 is shown in FIG. 1A. The grid support 220 is coupled to the processing chamber 110 as shown in FIG. 1A. The grid 210 is coupled to the grid support 220. The grid 210 is disposed above the substrate support 112. In FIG. 3, the grid 210 and the grid support 220 are positioned in substantially the same plane.

The grid 210 is coupled to the grid support 220 using a plurality of spokes 430. The spokes 430 are coupled to the grid 210 and the grid support 220. The grid 210, grid support 220, and spokes 430 form a grid assembly 400. As shown in FIG. 3 in some embodiments, two spokes 430 are used to couple the grid 210 to the grid support 220. In other embodiments, more spokes 430 are used such as eight in FIG. 4.

Figure 4:
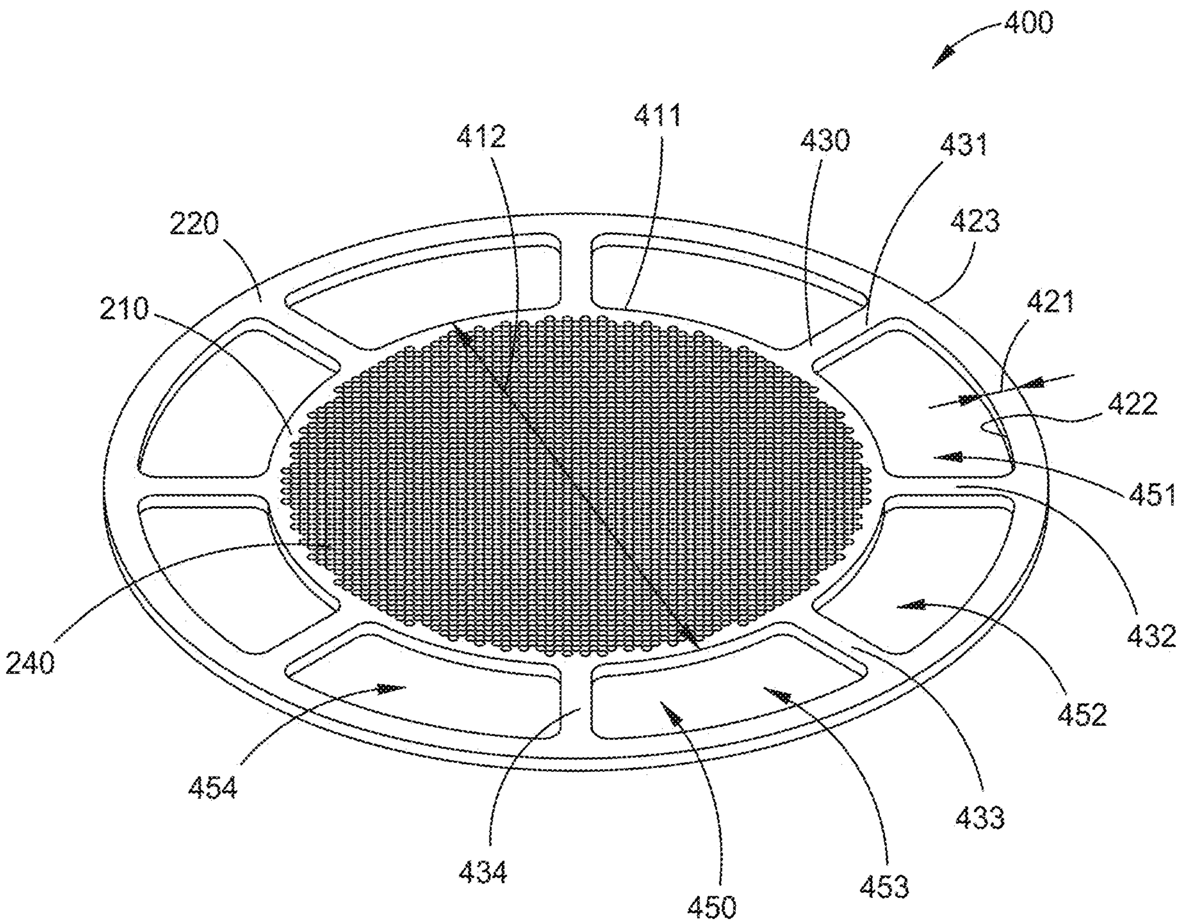
FIG. 4 is an isometric view of the grid and grid support of FIG. 3, according to at least one embodiment.

The grid 210 includes the plurality of holes 240. The holes 240 are disposed through the grid 210 (e.g., holes 240 traverse the thickness of the grid 210). One or more outer openings 450 (shown in FIG. 4) are defined by the grid 210, the grid support 220, and spokes 430. The grid 210 is configured to separate the processing chamber 110 area from the plasma source 120. The plasma source 120 contains plasma charged particles (ions and electrons), which recombine on the grid 210, so that only neutral plasma species can pass through the grid into the processing chamber 110. The plurality of holes 240 in the bottom section of the grid 210 may have different patterns and sizes, as shown in FIG. 4. The one or more outer openings 250 may have different sizes, as shown in FIG. 4.

The plasma processing apparatus 100 shown in FIGS. 1A and 3 is an example plasma processing apparatus 100. It is contemplated that the grid assembly 400 could be used in a variety of plasma processing apparatuses not just the one shown in FIGS. 1A and 3.

FIG. 4 is an isometric view of the grid 210 and grid support 220 of FIG. 3. FIG. 4 shows one hole 240 pattern that may be implemented with the grid 210. In some embodiments, other hole 240 patterns are implemented. The plurality of spokes 430 are used to couple the grid 210 to the grid support 220. In FIG. 4, eight spokes 430 are shown, the first four are defined for illustration: a first spoke 431, a second spoke 432, a third spoke 433, and a fourth spoke 434. In some embodiments a different number of spokes 430 is implemented.

The grid 210 is circular in shape and has a circumference 411 and a diameter 412. The grid support 220 is ring shaped and has a radial length 421, an inner circumference 422 and an outer circumference 423. In some embodiments, the spokes 430 are coupled to the grid 210 on the circumference 411 of the grid 210. On the opposite end, the spokes 430 are coupled to the grid support 220 on the inner circumference 422 of the grid support 220.

The outer openings 450 are shown in FIG. 4. Each outer opening is defined by a portion of the circumference 411 of the grid 210, a portion of the inner circumference 422 of the grid support 220, and the spokes 430. In FIG. 4, eight outer openings 250 are shown, the first four of which are shown for illustration: a first outer opening 451, a second outer opening 452, a third outer opening 453, and a fourth outer opening 454. The first outer opening 451 is defined by a first portion of the circumference 411 of the grid 210, a first portion of the inner circumference 422 of the grid support 220, the first spoke 431, and the second spoke 432. The second outer opening 452 is defined by a second portion of the circumference 411 of the grid 210, a second portion of the inner circumference 422 of the grid support 220, the second spoke 432, and the third spoke 433. The third outer opening 453 is defined by a third portion of the circumference 411 of the grid 210, a third portion of the inner circumference 422 of the grid support 220, the third spoke 433, and the fourth spoke 434. The fourth outer opening 454 is defined by a fourth portion of the circumference 411 of the grid 210, a fourth portion of the inner circumference 422 of the grid support 220, the fourth spoke 434, and a fifth spoke.

Figure 5:
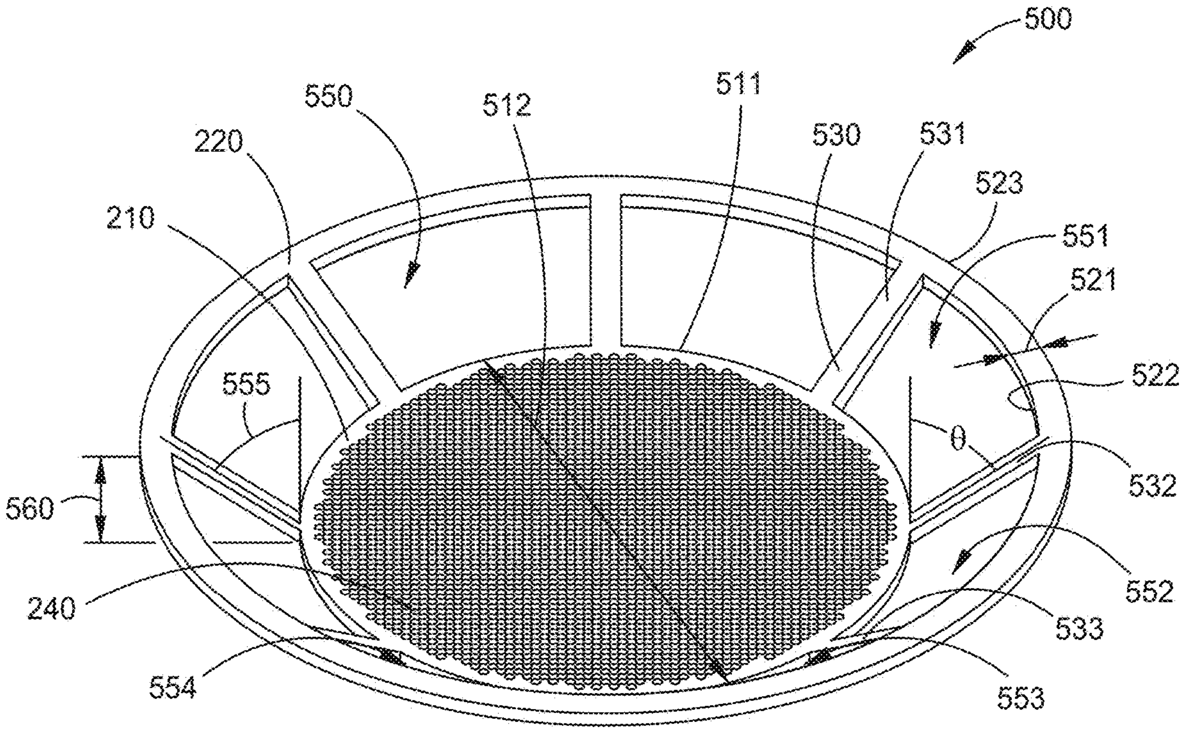
FIG. 5 is an isometric view of the grid and grid support with angled supports, according to at least one embodiment.

FIG. 5 is an isometric view of the grid 210 and grid support 220 with a plurality of angled supports 530. The grid 210, grid support 220, and angled supports 530 form a grid assembly 500. FIG. 5 illustrates one hole 240 pattern that may be implemented with the grid 210. In some embodiments, other hole 240 patterns are implemented.

The plurality of angled supports 530 couple the grid 210 to the grid support 220. In FIG. 5, angled supports 530 are shown, the first four of which are defined for illustration: a first angled support 531, a second angled support 532, a third angled support 533, and a fourth angled support (not shown). In some embodiments, a different number of angled supports 530 is implemented. The angled supports 530 have an angle 555 defined between the angled support 530 and a normal axis of the grid 210. The angle 555 is greater than 0 degrees and less than 90 degrees. When the angle 555 approaches 0 degrees, including 0 degrees, the grid assembly 500 acts like the grid assembly 200. When the angle 555 approaches 90 degrees, including 90 degrees, the grid assembly 500 acts like the grid assembly 400.

In various embodiments, the grid 210 has a circular shape having a circumference 511 and a diameter 512. For example, the grid support 220 may be ring-shaped and have a radial length 521, an inner circumference 522, and an outer circumference 523. In some embodiments, the angled supports 530 are coupled to the grid 210 on the circumference 511 of the grid 210. On the opposite end, the angled supports 530 are coupled to the grid support 220 on the inner circumference 522 of the grid support 220. The grid support 220 and the grid 210 are separated by a distance 560. The distance 560 is dependent on the angle 555 and a length of the angled supports 530. The relationship is defined by the following equation, where D is the distance 560, L is the length of the angled support, and θ is the angle 555.

$$D=L\cos\theta$$

The distance 560 may be greater than 0 inches and less than 3 inches. The grid 210 and the grid supports 220 are positioned on separate parallel planes.

A plurality of outer openings 550 are shown in FIG. 5. Each outer opening is defined by a portion of the circumference 511 of the grid 210, a portion of the inner circumference 522 of the grid support 220, and the angled supports 530. In FIG. 5, eight outer openings 550 are shown, the first four of which are shown for illustration: a first outer opening 551, a second outer opening 552, a third outer opening 553, and a fourth outer opening 554. The first outer opening 551 is defined by a first portion of the circumference 511 of the grid 210, a first portion of the inner circumference 522 of the grid support 220, the first angled support 531, and the second angled support 532. The second outer opening 552 is defined by a second portion of the circumference 511 of the grid 210, a second portion of the inner circumference 522 of the grid support 220, the second angled support 532, and the third angled support 533. The third outer opening 553 is defined by a third portion of the circumference 511 of the grid 210, a third portion of the inner circumference 522 of the grid support 220, the third angled support 533, and the fourth angled support. The fourth outer opening 554 is defined by a fourth portion of the circumference 511 of the grid 210, a fourth portion of the inner circumference 522 of the grid support 220, the fourth angled support, and a fifth angled support.

In summation, a grid 210 for use in a plasma processing apparatus 100 is provided. The grid 210 and grid support 220 have many advantages. Such advantages include the grid assembly 200 increasing the uniformity of the plasma distribution. The adjustable grid 210 allows the height between the grid 210 and the substrate 114 to be adjusted. The adjustable height also affects the hole diameter 241 that is selected. Additionally, the diameter 212 of the grid 210 causes increased plasma flow beyond the circumference 211 of the grid 210, through the outer openings 250, to treat the edges of the substrate 114. In embodiments including the grid assembly 400, the outer openings 450 allow for plasma to reach the edges of the substrate 114 and provide more uniform treatment of the edges of the substrate 114. The embodiments of the disclosure may be retrofitted to current plasma chambers. The embodiments further allow for the processing chambers 110 and plasma sources 120 to be opened without interacting with the grid 210. In some embodiments, the grid 210, grid support 220, vertical supports 230, and spokes 430 may be composed of different materials.

While the foregoing is directed to embodiments of the present disclosure, other and further embodiments of the disclosure may be devised without departing from the basic scope thereof, and the scope thereof is determined by the claims that follow.

What is claimed is:

1. A plasma processing apparatus, comprising:

a processing chamber;

a substrate support disposed within the processing chamber;

a grid support coupled to the processing chamber;

a grid comprising a plurality of holes coupled to the grid support, and disposed above the substrate support; and one or more outer openings defined between a circumference of the grid and the grid support, wherein plasma received from a plasma source is configured to flow through the plurality of holes and the one or more outer openings towards the substrate support, and wherein the grid is suspended a distance below the grid support by a plurality of vertical supports.

2. The plasma processing apparatus of claim 1, wherein the one or more outer openings are further defined by the plurality of vertical supports.

3. The plasma processing apparatus of claim 2, wherein the distance between the grid and the grid support is adjustable via the plurality of vertical supports, and the distance is about 1 inch to about 3 inches.

4. The plasma processing apparatus of claim 1, wherein the substrate support is configured to receive a substrate having a first diameter, and a second diameter of the grid is less than the first diameter.

5. The plasma processing apparatus of claim 1, wherein the grid and the grid support are positioned on substantially the same plane and are coupled by a plurality of spokes.

6. The plasma processing apparatus of claim 5, wherein the one or more outer openings of the grid are further defined by the plurality of spokes.

7. The plasma processing apparatus of claim 1, wherein the plurality of holes comprise about 10% to about 70% of a surface area of a first surface of the grid.

8. The plasma processing apparatus of claim 1, wherein each hole of the plurality of holes has a diameter of about 0.1 inches to about 1 inch.

9. The plasma processing apparatus of claim 1, wherein a process liner is coupled between the processing chamber and the grid.

10. The plasma processing apparatus of claim 1, wherein the grid is suspended at the distance below the grid support by a plurality of angled supports, and the plurality of angled supports have an angle between the angled supports and a normal axis of the grid.

11. A plasma processing apparatus, comprising:

a processing chamber;

a substrate support disposed within the processing chamber;

a grid support coupled to the processing chamber;

a grid comprising a plurality of holes that is coupled to and suspended a distance below the grid support via a plurality of vertical supports and is disposed above the substrate support; and one or more outer openings defined by a circumference of the grid, the grid support, and the plurality of vertical supports, wherein plasma received from a plasma source is configured to flow through the plurality of holes and the one or more outer openings towards the substrate support.

12. The plasma processing apparatus of claim 11, wherein a distance between the grid and the grid support is adjustable via the plurality of vertical supports.

13. The plasma processing apparatus of claim 11, wherein the substrate support is configured to receive a substrate having a first diameter, and a second diameter of the grid is less than the first diameter.

14. The plasma processing apparatus of claim 11, wherein the plurality of holes comprise about 10% to about 70% of a surface area of a first surface of the grid.

15. The plasma processing apparatus of claim 11, wherein each hole of the plurality of holes has a diameter of about 0.1 inches to about 1 inch.

16. A grid assembly, comprising:

a grid support;

a grid coupled to the grid support;

a plurality of holes disposed through the grid; and one or more outer openings defined between a circumference of the grid and a circumference of the grid support, wherein a plasma is configured to flow through the plurality of holes and the one or more outer openings of the grid, wherein the grid is coupled to and suspended a distance below the grid support via a plurality of vertical supports.

17. The grid assembly of claim 16, wherein the grid and the grid support are positioned within substantially the same plane, and the grid is coupled to the grid support via a plurality of spokes.

18. The grid assembly of claim 16, wherein the grid is coupled to and suspended a distance below the grid support via a plurality of supports, and the plurality of supports are angled supports, wherein the angled supports form a first angle with a plane of the grid and a second angle with an axis normal to the plane of the grid.

* * * * *